United States Patent
Ikeda et al.

(10) Patent No.: US 7,301,976 B2
(45) Date of Patent: Nov. 27, 2007

(54) METHOD AND APPARATUS FOR SEMICONDUCTOR LASER DRIVING CAPABLE OF STABLY GENERATING CONSISTENT OPTICAL PULSE WIDTHS OF LASER DIODES

(75) Inventors: Junichi Ikeda, Tokyo (JP); Hiroaki Kyougoku, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 237 days.

(21) Appl. No.: 10/972,359

(22) Filed: Oct. 26, 2004

(65) Prior Publication Data
US 2005/0141576 A1 Jun. 30, 2005

(30) Foreign Application Priority Data
Oct. 27, 2003 (JP) ............... 2003-366060

(51) Int. Cl.
H01S 3/00 (2006.01)
(52) U.S. Cl. ............. 372/38.02; 372/38.1; 372/38.01
(58) Field of Classification Search ......... 372/38.1, 372/38.02, 38.01
See application file for complete search history.

(56) References Cited

U.S. PATENT DOCUMENTS

| | | | | |
|---|---|---|---|---|
| 4,813,048 A | * | 3/1989 | Yamane et al. | 372/38.07 |
| 5,237,579 A | * | 8/1993 | Ema et al. | 372/31 |
| 5,912,694 A | * | 6/1999 | Miyake et al. | 347/247 |
| 5,946,334 A | * | 8/1999 | Ema et al. | 372/38.01 |
| 6,118,798 A | * | 9/2000 | Ema et al. | 372/29.011 |
| 6,278,322 B1 | | 8/2001 | Aisu | |
| 6,421,314 B1 | * | 7/2002 | Maruyama | 369/116 |
| 6,728,276 B2 | * | 4/2004 | Shapiro et al. | 372/38.02 |
| 2003/0035451 A1 | | 2/2003 | Ishida | |
| 2004/0052281 A1 | * | 3/2004 | Hamajima et al. | 372/38.01 |

FOREIGN PATENT DOCUMENTS

| | | |
|---|---|---|
| JP | 2003-154705 | 5/2003 |
| JP | 2006-139029 | 6/2006 |
| JP | 2006-139214 | 6/2006 |
| JP | 2006-139216 | 6/2006 |
| JP | 2006-153676 | 6/2006 |
| JP | 2006-160512 | 6/2006 |

\* cited by examiner

*Primary Examiner*—Minsun Oh Harvey
*Assistant Examiner*—Phillip Nguyen
(74) *Attorney, Agent, or Firm*—Dickstein Shapiro LLP (57) ABSTRACT

A semiconductor laser driving circuit includes a light amount detector, a frequency determiner, and an initialization circuit. The light amount detector detects an amount of light emitted by a laser diode, and outputs a first voltage corresponding to the amount of light. The frequency determiner determines a frequency for determining a time period of a detecting operation to detect differential quantum efficiency of the laser diode. The initialization circuit performs an initialization operation to detect differential quantum efficiency of the laser diode with a variation of the time period of the initialization operation according to the frequency determined by the frequency determiner.

19 Claims, 4 Drawing Sheets

METHOD AND APPARATUS FOR SEMICONDUCTOR LASER DRIVING CAPABLE OF STABLY GENERATING CONSISTENT OPTICAL PULSE WIDTHS OF LASER DIODES

The present application claims priority to Japanese patent application, No. JPAP 2003-366060 filed on Oct. 27, 2003, the entire contents of which are incorporated by reference herein.

BACKGROUND

1. Field of the Invention

The present invention generally relates to a method and apparatus for semiconductor laser driving. In particular, the present invention relates to a method and apparatus for semiconductor laser driving capable of effectively reducing a time period for detecting differential quantum efficiency of a laser diode.

2. Description of the Related Art

A laser diode is a semiconductor laser which is small in size and performs a high-speed modulation driven by a drive current. In recent years, the laser diode has been widely used as a light source of an image forming apparatus such as a laser printer and so forth.

The laser diode generally employs one of two laser driving methods, which are a non-bias method and a bias method. A laser diode employing the non-bias method is driven by a pulsed current corresponding to an input signal, without a bias current. A laser diode employing the bias method is driven by a bias current and a pulsed current added to the bias current. The bias current applied to the laser diode has an amount smaller than that of a threshold current Ith of the laser diode, and the pulsed current corresponds to the input signal.

When compared with the laser diode with the non-bias method, the laser diode with the bias method may reduce a delay time required until a carrier density which may reach a level to cause a laser oscillation is obtained. That is, a delay time from a period the pulsed current corresponding to the input signal is applied to the laser diode to a period the laser diode emits a laser beam may be reduced. Consequently, the laser diode with the bias method has been generally used.

However, a background laser diode driving integrated circuit (LD driving IC) employing the above-described bias method uses a bias current that is fixed to a predetermined value. When such LD driving IC is used in a tandem color image forming apparatus and a multiple beam image forming apparatus including a plurality of laser diodes, threshold current values of respective laser diodes used in the apparatuses may not be consistent due to variations from production of the laser diodes or due to an operating temperature thereof. With such inconsistency in the threshold current values, the background LD driving IC cannot stably generate consistent optical pulse widths, resulting in a production of an inferior image quality.

High-resolution image forming apparatuses such as high-resolution printers, image forming systems using a 650-nm red laser diode, a 400-nm ultraviolet laser diode and so forth are now under development. These laser diodes need to take a relatively long duration to obtain a carrier density which may, in turn, generate a carrier density which may reach a level to cause a laser oscillation, when compared with conventional laser diodes having wavelengths of 780 nm and 1.3 μm. Thereby, the background LD driving IC using the bias method obtains a pulse having variations in pulse widths. That is, the pulse widths becomes narrower than a desired pulse width. Furthermore, with the recent developments of high-speed printers, narrower and more stable pulse widths are demanded for a desired width of an optical pulse.

To eliminate the above-described problem, differential quantum efficiency of a laser diode is taken into account. For stably generating consistent optical pulse widths, differential quantum efficiencies of laser diodes need to be detected. However, the time period required to detect the differential quantum efficiencies depend on characteristics of the laser diodes. The detection time period is generally determined according to a laser diode that takes the longest amount of time to detect the differential quantum efficiency. That is, the other laser diodes that have characteristics requiring a shorter detection time period need to keep pace with the laser diode taking the longest amount of time to detect the differential quantum efficiency. The above-described status has adversely affected a reduction of the detection time period of the differential quantum efficiency.

SUMMARY

The present invention has been made in view of the above-described circumstances.

An object of the present invention is to provide a semiconductor laser driving circuit capable of stably generating consistent optical pulse widths of laser diodes by detecting differential quantum efficiencies during a period according to characteristics of the laser diodes, and effectively reducing a time period for detecting the differential quantum efficiencies according to the characteristics of the laser diodes.

Another object of the present invention is to provide a semiconductor laser driving circuit that includes a single integrated circuit performing an initialization operation to detect differential quantum efficiency of a laser diode, a light amount detector, and a resistor disposed external to the single integrated circuit.

Another object of the present invention is to provide a semiconductor laser driving circuit that includes a single integrated circuit performing an initialization operation to detect differential quantum efficiency of a laser diode, a light amount detector, and a capacitor disposed external to the single integrated circuit.

A novel semiconductor laser driving circuit includes a light amount detector, frequency determiner, clock signal generator, bias current generator, logic controller, and a pulsed current generator. The light amount detector is configured to detect an amount of light emitted by a laser diode and output a first voltage corresponding to the amount of light. The frequency determiner is configured to determine a frequency for determining a time period of a detecting operation to detect differential quantum efficiency of the laser diode. The clock signal generator is configured to generate a clock signal based on the frequency. The bias current generator is configured to generate a bias current having a direct current and output the bias current to the laser diode to cause the first voltage output by the light amount detector to accord with a predetermined target voltage. The logic controller is configured to perform the detecting operation in accordance with the clock signal, output a data code signal to the pulsed current generator indicating a current modulation value derived from the differential quantum efficiency of the laser diode, output a control signal specifying a second voltage to the bias current generator, and vary the time period of the detection operation according to the clock signal generated based on the frequency determined by the frequency determiner. The pulsed current generator is configured to generate a pulsed current responsive to the data code signal and output the pulsed current to the laser diode in response to an external control signal.

The bias current generator may include an operational amplifier circuit, voltage-current conversion circuit, switch, and a sample and hold capacitor. The operational amplifier circuit is configured to compare the first voltage output by the light amount detector and the second voltage specified by the logic controller and output a third voltage indicating a difference between the first and second voltages to control the bias current. The voltage-current conversion circuit is configured to convert the third voltage from the operational amplifier circuit into the bias current and output the bias current to the laser diode. The switch is configured to operate at an instruction of the logic controller and allow a passage of the third voltage from the operational amplifier circuit. The sample and hold capacitor is configured to store the third voltage output from the operational amplifier circuit and output the third voltage to the voltage-current conversion circuit.

The operational amplifier circuit may receive an instruction of the logic controller, and control a supply capacity thereof to output the second voltage. The logic controller may control the switch to charge the third voltage output by the operational amplifier circuit to the sample and hold capacitor, and cause the operational amplifier circuit to increase the supply capacity of the operational amplifier circuit.

The operational amplifier circuit may include a first operational amplifier configured to control the third voltage of the sample and hold capacitor by an intermediary of the switch and induce the first voltage output by the light amount detector to accord with the second voltage specified by the logic controller, and a second operational amplifier configured to increase an operating current at an instruction of the logic controller. The second operational amplifier may be disposed in parallel with the first operational amplifier.

The frequency determiner may include a resistor. The frequency may be determined according to a resistor value.

The pulse current generator, the voltage-current conversion circuit of the bias current generator, the operational amplifier circuit, the switch, the logic controller, and the clock signal generator may be integrated on a single integrated circuit that is external to the resistor, and the resistor may be disposed external to the single integrated circuit.

The frequency determiner may include a capacitor. The frequency may be determined according to a capacitor value.

The pulse current generator, the voltage-current conversion circuit of the bias current generator, the operational amplifier circuit, the switch, the logic controller, and the clock signal generator are integrated on a single integrated circuit, and the capacitor may be disposed external to the single integrated circuit.

In one exemplary embodiment, a novel method of semiconductor laser driving includes the steps of detecting an amount of light emitted by a laser diode, outputting a first voltage corresponding to the amount of light, determining a frequency for determining a time period of a detecting operation to detect differential quantum efficiency of the laser diode, forming a clock signal based on the frequency, performing the detecting operation in accordance with the clock signal, issuing a data code signal indicating a current modulation value derived from the differential quantum efficiency of the laser diode and a control signal specifying a second voltage, generating a bias current based on the second voltage to cause the first voltage to accord with a predetermined target voltage, supplying the bias current to the laser diode, producing a pulsed current responsive to the data code signal, and supplying the pulsed current to the laser diode in response to an external control signal.

The generating step may include the steps of comparing the first voltage output by the detecting step and the second voltage specified by the performing step, outputting a third voltage indicating a difference between the first and second voltages to control the bias current, converting the third voltage output by the comparing step into the bias current, outputting the bias current to the laser diode, switching an operation to allow a passage of the third voltage output by the comparing step, storing the third voltage output by the comparing step, and outputting the third voltage for the converting step.

The comparing step may receive an instruction output by the performing step, and control a supply capacity thereof to output the second voltage. The performing step may control the switching step to charge the third voltage output by the comparing step to the storing step, and cause the comparing step to increase the supply capacity of the comparing step.

The comparing step may include the steps of increasing the third voltage output by the storing step after the switching step, inducing the first voltage output by the detecting step to accord with the second voltage specified by the performing step, and amplifying an operating current at an instruction by the performing step.

The determining step may include a resistor. The frequency may be determined according to a resistor value.

The determining step may include a capacitor. The frequency may be determined according to a capacitor value.

In one exemplary embodiment, a semiconductor laser driving circuit includes a light amount detector configured to detect an amount of light emitted by a laser diode, and output a first voltage corresponding to the amount of light, a resistor configured to control a frequency for determining a time period of a detecting operation to detect differential quantum efficiency of the laser diode, and an initialization circuit configured to perform an initialization operation to detect differential quantum efficiency of the laser diode with a variation of the time period of the initialization operation according to the frequency determined by the resistor. The initialization circuit may be integrated on a single integrated circuit disposed external to the light amount detector and the resistor.

In one exemplary embodiment, a novel semiconductor laser driving circuit includes a light amount detector configured to detect an amount of light emitted by a laser diode, and output a first voltage corresponding to the amount of light, a capacitor configured to control a frequency for determining a time period of a detecting operation to detect differential quantum efficiency of the laser diode, and an initialization circuit configured to perform an initialization operation to detect differential quantum efficiency of the laser diode with a variation of the time period of the initialization operation according to the frequency determined by the capacitor. The initialization circuit may be integrated on a single integrated circuit disposed external to the light amount detector and the capacitor.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referring now to the drawings, wherein like reference numerals designate identical or corresponding parts throughout the several views, preferred embodiments of the present invention are described.

Figure 1:
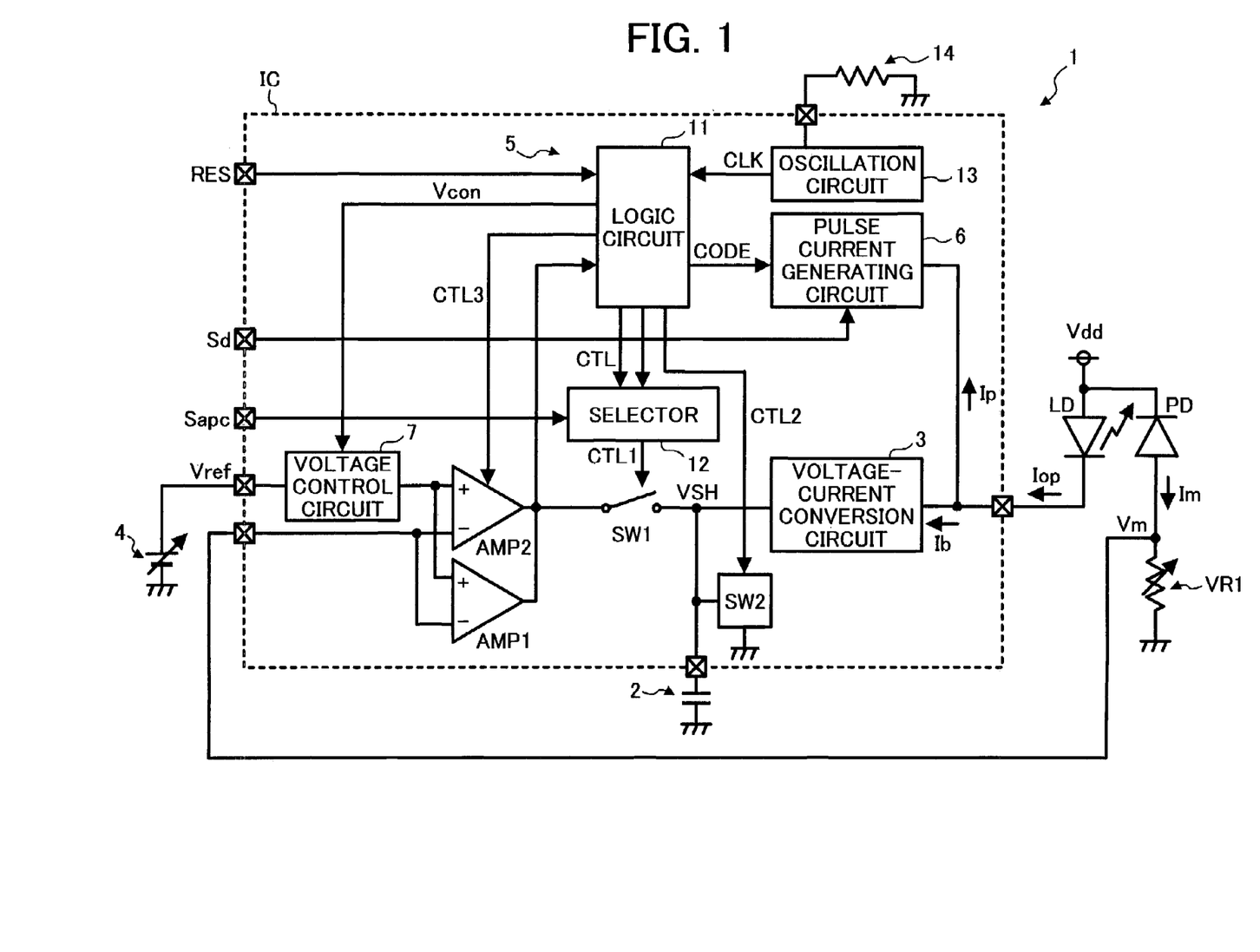
FIG. 1 is a block diagram of a system structure of a semiconductor laser driving circuit according to an exemplary embodiment of the present invention.

Referring to FIG. 1, a block diagram of a system structure of a semiconductor laser driving circuit 1 according to an exemplary embodiment of the present invention is described.

In FIG. 1, the semiconductor laser driving circuit 1 includes operational amplifiers AMP1 and AMP2, switches SW1 and SW2, a sample and hold (SH) capacitor 2, a voltage-current conversion circuit 3, a variable resistor VR1, a reference volume generating circuit 4, a control circuit 5, a photodiode PD, a pulsed current generating circuit 6, and a voltage control circuit 7.

The semiconductor laser driving circuit 1 including the above-described units controls light emission operations of a laser diode LD. The laser diode LD is a light emitting device including an anode and a cathode. The cathode of the laser diode LD is connected to the voltage-current conversion circuit 3, and the anode of the laser diode LD is connected to a power supply voltage Vdd. The power supply voltage Vdd is also connected to the cathode of the photodiode PD.

The operational amplifiers AMP1 and AMP2 have respective output ends that are connected to each other at a predetermined connection point. The predetermined connection point of the operational amplifiers AMP1 and AMP2 is connected to one end of the switch SW1.

The operational amplifiers AMP1 and AMP2 respectively compare the voltage output from the voltage control circuit 7 and from a voltage output from the variable resistor VR1, and output one of the voltages based on a difference obtained from the comparison.

For example, a control signal CTL3 is issued by the logic circuit 11 to the operational amplifier AMP2 at initialization to control the operational amplifier AMP2. When a status of the control signal CTL3 is at high level, the operational amplifier AMP2 starts its operations. When the status of the control signal CTL3 turns to low level, the operational amplifier AMP2 stops its operations. When the control signal CTL3 is at low level, the output end of the operational amplifier AMP2 has high impedance.

The switch SW1 has two ends. One end of the switch SW1 is connected to the predetermined connection point of the operational amplifiers AMP1 and AMP2. The other end of the switch SW1 is connected to the voltage-current circuit 3 at a predetermined connection point. The predetermined connection point of the switch SW1 and the voltage-current conversion circuit 3 extends to a grounding voltage, and the sample and hold capacitor 2 and the switch SW2 are provided in parallel therebetween.

The switch SW1 receives a control signal CTL1, which is selected from two signals, from the control circuit 5 for performing its switching operations. The switch SW1 controls connection and disconnection between the sample and hold capacitor 2 and the operational amplifiers AMP1 and AMP2 so that a voltage VSH stored by the sample and hold capacitor 2 is held. That is, when the switch SW1 is open, the voltage VSH of the sample and hold capacitor 2 is reserved.

The switch SW2 is connected between the switch SW1 and the voltage-current conversion circuit 3, in parallel with the sample and hold capacitor 2. The switch SW2 performs switching operations according to a control signal CT2 input from the logic circuit 11.

The switch SW2 is closed to discharge the sample and hold capacitor 2 when the laser diode LD is forcedly turned off, for example, when a reset operation is performed at the power on.

The sample and hold capacitor 2 is a capacitor to store voltages output from the operational amplifiers AMP1 and AMP2. As previously described, the sample and hold capacitor 2 discharges the stored voltages at a close of the switch SW2.

The voltage-current conversion circuit 3 is a power source generating a bias current Ib as a direct bias current corresponding to the voltage VSH so that the bias current Ib is supplied to the laser diode LD.

As previously described, one end of the voltage-current circuit 3 is connected to the switch SW1 at the predetermined connection point.

The variable resistor VR1 is connected between the anode of the photodiode PD and the ground voltage.

The variable resistance VR1 receives a monitor current Im and converts the monitor current Im to a monitor voltage Vm.

The monitor current Im is generated by the photodiode PD, and is output to the variable resistor VR1 so that the monitor voltage Vm is generated according to the monitor current Im.

The monitor voltage Vm is generated by the variable resistor VR1 according to the monitor current Im, and is output to the operational amplifiers AMP1 and AMP2 so that the monitor voltage Vm and the reference voltage Vref or a reference voltage Vref/2, which will be described later, output by the voltage control circuit 7 are compared.

The reference voltage generating circuit 4 is provided outside an integrated circuit (IC) board of the semiconductor laser driving circuit 1, and is connected with the operational amplifiers AMP1 and AMP2 through one of terminals of the IC board.

The reference voltage generating circuit 4 generates a predetermined reference voltage Vref to specify an amount of light of the laser diode LD, and outputs the reference voltage Vref to the operational amplifiers AMP1 and AMP2.

The control circuit 5 is a structure to control the switches SW1 and SW2, and the operational amplifier AMP2 to perform initialization operations. The control circuit 5 includes a logic circuit 11, a selector 12, an oscillation circuit 13 and a resistor 14. Detailed descriptions of the above-described units will be described later.

The pulsed current generating circuit 6 generates a pulsed current Ip according to a data signal CODE. When the data signal CODE determining a value of a pulsed current is issued by the logic circuit 11, the pulsed current generating circuit 6 generates the pulsed current Ip so that the pulsed current Ip is supplied to the laser diode LD.

The pulsed current Ip is generated according to the data signal CODE that is obtained in response to the clock signal CLK input from the resistor 14 provided outside the IC board of the semiconductor laser driving circuit 1. The pulsed current generating circuit 6 controls outputs of the pulsed current Ip in response to a control signal Sd.

The control signal Sd is issued by a device provided outside the pulsed current generating circuit 6. In response to the control signal Sd, the pulsed current Ip is supplied to the laser diode LD.

When a differential quantum efficiency of the laser diode LD is detected, that is, when the initialization operations are performed, the pulsed current generating circuit 6 generates the pulsed current Ip according to the data signal CODE.

The voltage control circuit 7 receives the reference voltage Vref output by the reference voltage generating circuit 4 and a control signal Vcon output by the logic circuit 11.

The control signal Vcon is issued by the logic circuit 11 to the voltage control circuit 7 so that a voltage generated for the initialization operations.

In response to the control signal Vcon, the voltage control circuit 7 reserves the voltage Vref or generates a voltage having a half value of the predetermined reference voltage Vref. The half value of the predetermined reference voltage Vref is hereinafter referred to as a "voltage Vref/2". Either one of the voltages Vref and Vref/2 is output to the operational amplifiers AMP1 and AMP2.

After reserving the voltage Vref or generating the voltage Vref/2 for setting the amount of light of the laser diode LD, the voltage control circuit 7 outputs one of the voltage Vref and the voltage Vref/2 in response to the control signal Vcon from the logic circuit 11 of the control circuit 5, to respective non-inverting input ends of the operational amplifiers AMP1 and AMP2 during the initialization.

When the initialization operation is completed and automatic power control (APC) operations, the voltage control circuit 7 outputs the reference voltage Vref from the reference voltage generating circuit 4 to the respective non-inverting input ends of the operational amplifiers AMP1 and AMP2.

Accordingly, when the logic circuit 11 is in a reset mode, the voltage control circuit 7 outputs either one of the voltages Vref or Vref/2 to the operational amplifiers AMP1 and AMP2, and when the logic circuit 11 is not in the reset mode, the voltage control circuit 7 outputs the voltage Vref to the operational amplifiers AMP1 and AMP2.

The photodiode PD is a light receiving element including an anode and a cathode. The anode of the photodiode PD is connected to the variable resistor VR1 at a predetermined connection point, and the cathode of the photodiode PD is connected to the power supply voltage Vdd.

The predetermined connection point connecting the anode of the photodiode PD and the variable resistor VR1 is connected to respective inverting input ends of the operational amplifiers AMP1 and AMP2.

The operational amplifier AMP2 operates only when performing the initialization according to a control signal CTL3 output from the logic circuit 11. The photodiode PD generates the monitor current Im, that is, in proportion to the amount of light of the laser diode LD, and outputs the monitor current Im.

Turning now to the control circuit 5 of FIG. 1, detailed descriptions of the units included in the control circuit 5 are described below.

As previously described, the control circuit 5 of FIG. 1 includes the logic circuit 11, the selector 12, the oscillation circuit 13 and the resistor 14.

The logic circuit 11 receives a clock signal CLK from the oscillation circuit 13, and operates according to the respective clock signal CLK that has a frequency changeable depending on a resistor value 14.

The logic circuit 11 receives a reset signal RES from a device provided outside the IC board of the semiconductor laser driving circuit 1, to enable the reset operations of the semiconductor laser driving circuit 1.

The reset signal RES is issued to forcedly turn off the IC board of the semiconductor laser driving circuit 1 including the laser diode LD. When the reset signal RES is at high level, the logic circuit 11 is in the reset mode.

The logic circuit 11 also receives a signal output from the respective output ends of the operational amplifiers AMP1 and AMP2 after the comparison is completed.

The logic circuit 11 controls operations of the selector 12, and outputs the control signal CTL1, which is one signal out of two signals, to the selector 12 for controlling actions of the switch SW1. To determine the control signal CTL1, a control signal CTL is issued by the logic circuit 11 and an automatic power control (APC) signal Sapc are input from an outside the IC board by one of a plurality of terminals of the IC board to the selector 12, where the control signal CTL and the APC signal Sapc are compared and a selected one of the control signal CTL and the APC signal Sapc is output as the control signal CTL1 to the switch SW1.

The APC signal Sapc is an enable signal enabling the APC operations. When the APC signal Sapc is at high level, that is when the control signal CTL is selected, the switch SW1 is turned on and the semiconductor laser circuit 1 becomes conductive. When the APC signal Sapc is at low level, that is when the APC signal is selected, the switch SW1 is turned off and the semiconductor laser circuit 1 becomes blocked.

The logic circuit 11 outputs the data signal CODE to the pulsed current generating circuit 6 for determining a value of a pulsed current to be output from the pulsed current generating circuit 6.

After the reset signal RES is asserted to change its status from high level to low level and the differential quantum efficiency of the laser diode is detected, the logic circuit 11 outputs one of the voltage of Vref or the voltage of Vref/2, to the voltage control circuit 7. At the same time, the logic circuit 11 outputs the control signal CTL as the control signal CTL1, to the selector 12 to control the switch SW1.

When performing the initialization operations, the logic circuit 11 outputs a control signal CTL2 to the switch SW2 to control its switching operation, and the control signal CTL3 to the operational amplifier AMP2 to control a start and stop of the operations performed by the operational amplifier AMP2.

When an automatic power control (APC) operation is performed, the logic circuit 11 outputs the control signal Vcon to the voltage control circuit 7 to output the reference voltage Vref, and outputs the APC signal Spac as the control signal CTL1 to the switch SW1 so as to turn off the switch SW2.

The selector 12 is controlled by the logic circuit 11. The selector 12 receives the control signal CTL output from the logic circuit 11 and the APC signal Sapc output from the outside of the IC board.

According to the logic circuit 11, the selector 12 selects one of the control signal CTL and the APC signal Sapc. When the reset signal RES is asserted by the logic circuit 11, the selector 12 outputs the control signal CTL, as the control signal CTL1, to the switch SW1. When the reset signal RES is negated by the logic circuit 11, the selector 12 outputs the APC signal Sapc, as the control signal CTL1, to the switch SW1.

The oscillation circuit 13 generates the clock signal CLK corresponding to the resistance generated by the resistor 14, and outputs the clock signal CLK to the logic circuit 11.

The resistor 14 is provided outside the IC circuit of the semiconductor laser driving circuit 1 and is connected to the oscillation circuit 13 through one of a plurality of terminals provided to the IC of the semiconductor laser driving circuit 1.

The resistor 14 changes its resistance to control the frequency of the clock signal CLK output to the logic circuit 11.

The voltage-current conversion circuit 3, the pulsed current generating circuit 6, the voltage control circuit 7, the operational amplifiers AMP1 and AMP2, the switches SW1 and SW2, the logic circuit 11, a selector 12 and the oscillation circuit 13 may be integrated on one integrated circuit (IC) to form a detector detecting the differential quantum efficiency.

Detailed operations of the semiconductor laser driving circuit 1 are described below.

While the reset signal RES is at high level, the logic circuit 11 is in the reset mode and a driving current Iop is not supplied to the laser diode LD. That is, when the logic current 11 is in the reset mode, the switch SW2 is turned on (closed) so that electric charge stored in the sample and hold capacitor 2 is discharged. The bias current Ib supplied from the voltage-current conversion circuit 3 becomes zero. The pulsed current generating circuit 6 receives the data signal CODE which indicates that the pulsed current Ip equals to zero. Regardless of the control signal Sd, the pulsed current Ip supplied to the laser diode LD becomes zero. The reset mode as described above occurs immediately after a power on of a system, at a time of the reset operation, or when a problem occurs in the system. The initialization operations are performed immediately after the reset mode is released.

Figure 2:
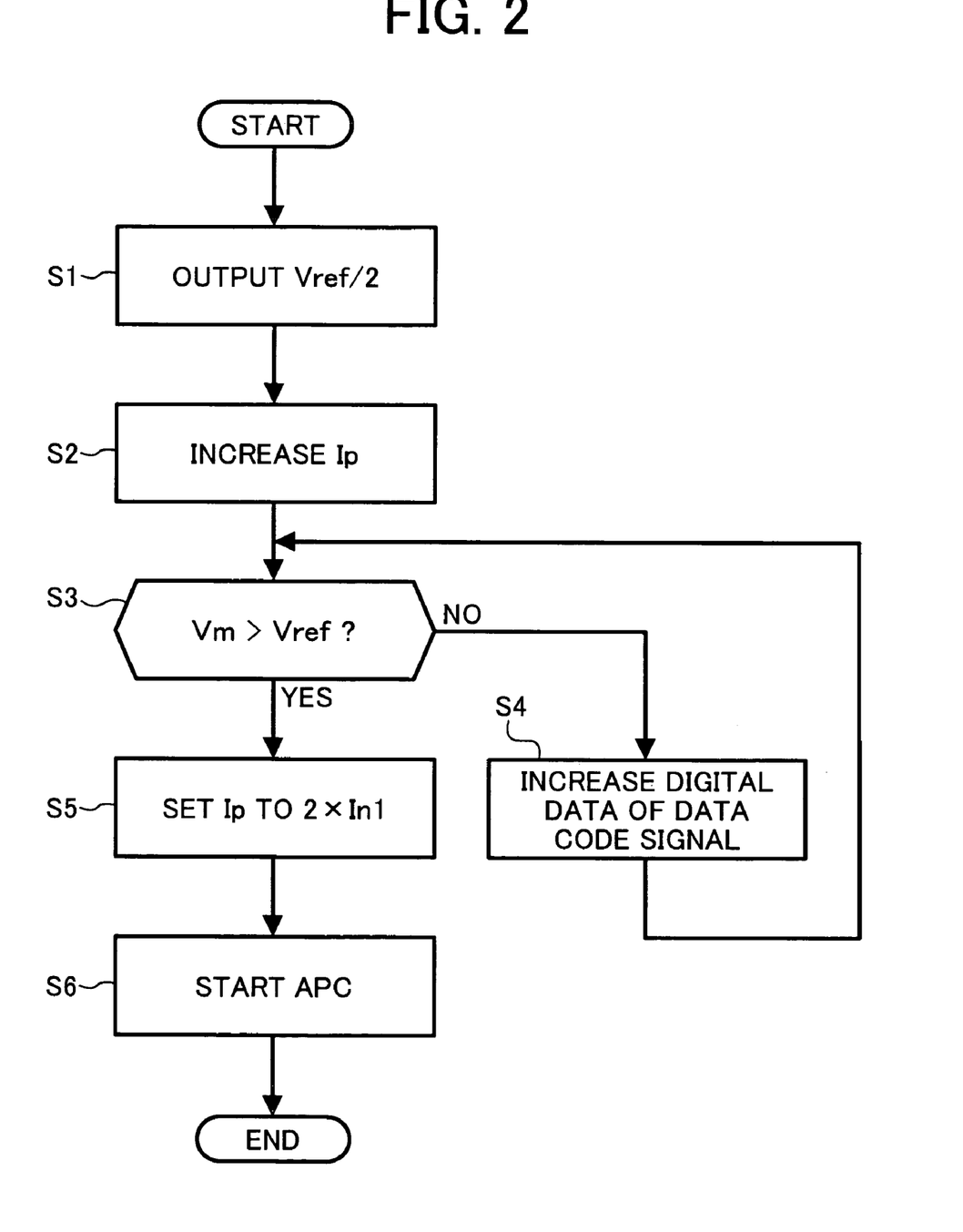
FIG. 2 is a flowchart showing an initializing process performed in the semiconductor laser driving circuit of FIG. 1.
Figure 3:
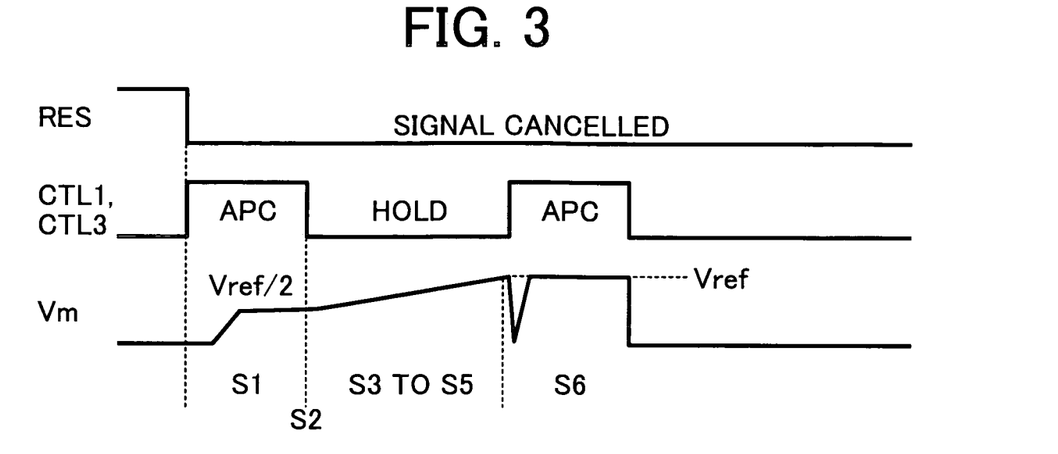
FIG. 3 is a timing chart showing a reset signal RES, control signals CTL1 and CTL3 and a monitor voltage in the initializing process of the semiconductor laser driving circuit of FIG. 1.
Figure 4:
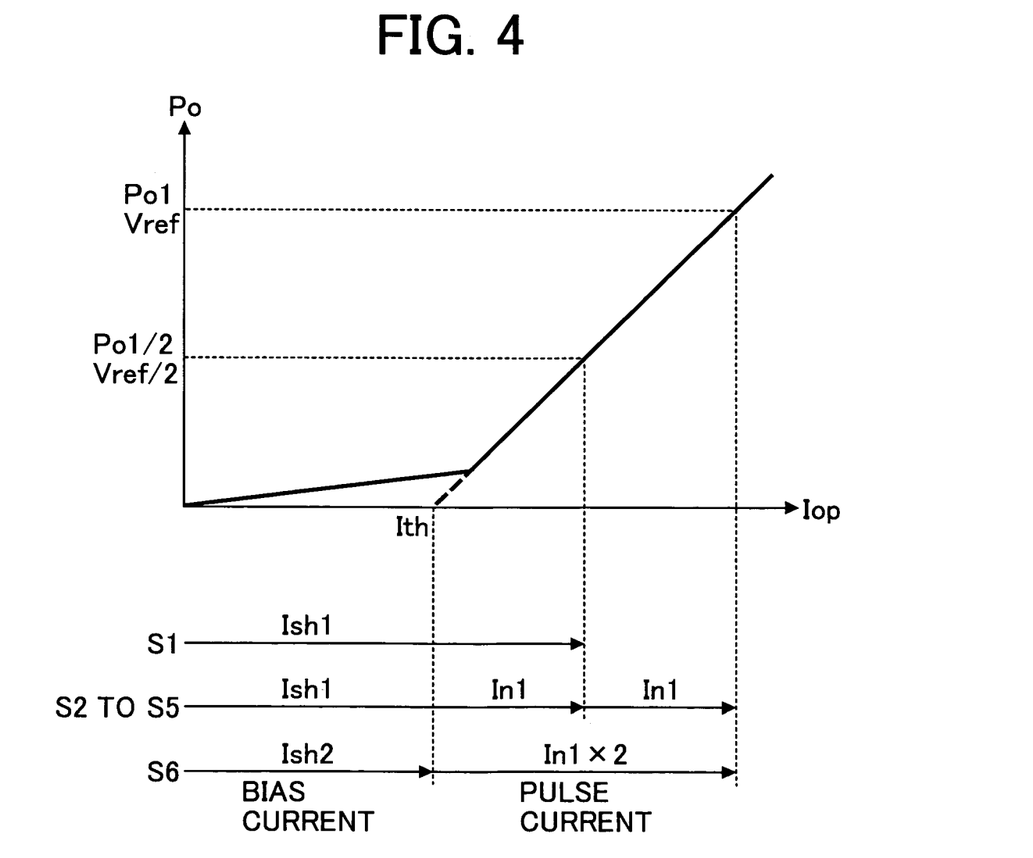
FIG. 4 is a drawing illustrating a relationship between an operating current Iop in the initializing process and an amount of light Po of a laser diode LD.

With reference to FIGS. 2 to 4, a description will be given of the initialization operations performed by the semiconductor laser driving circuit 1.

A flowchart of FIG. 2 shows a series initialization operations performed by the semiconductor laser driving circuit 1 of FIG. 1. The flowchart of FIG. 2 corresponds to a timing chart of FIG. 3 and a graph of FIG. 4. The timing chart of FIG. 3 shows transitions of signals exchanged in the semiconductor laser driving circuit 1 of FIG. 1 during the flow of the initialization operations shown in FIG. 2. The graph of FIG. 4 shows a relation between a driving current Iop and an amount of light Po of the laser diode LD during the flow of the initialization operations shown in FIG. 2.

A series of the initialization operations starts when the reset signal RES transits from a high level to a low level to cancel the reset mode to the logic circuit 11 as shown in FIG. 3, and the procedure goes to step S1 in the flowchart of FIG. 2. At a falling edge of the reset signal RES of FIG. 3, the control signals CTL1 and CTL3 turn from a low level to a high level to start the APC operations. A value of the monitor voltage Vm is smaller than that of the voltage Vref/2 as shown in FIGS. 3 and 4.

In step S1 in the flowchart of FIG. 2, the logic circuit 11 outputs the control signal CTL2 so that the switch SW2 is turned off. The logic circuit 11 outputs the control signal CTL to the selector 12 so that the selector 12 outputs the control signal CTL as the control signal CTL1 to turn on the switch SW1 so that the APC operation loop is formed. The logic circuit 11 further turns the control signal CTL3 to a high level so as to activate the operational amplifier AMP2. With the operations described above, the APC operation starts in a sample mode in which the sample and hold capacitor 2 is quickly charged with a voltage output by the operational amplifiers AMP1 and AMP2.

The logic circuit 11 outputs the control signal Vcon to the voltage control circuit 7 so that the voltage Vref/2 is output. The voltage control circuit 7 outputs the voltage Vref/2 to the respective non-inverting input ends of the operational amplifiers AMP1 and AMP2. As previously described, the operational amplifiers AMP1 and AMP2 charge the sample and hold capacitor 2 with a voltage obtained according to a result of comparison of the voltage Vref/2 and the monitor voltage Vm. According to a voltage of the sample and hold capacitor 2, the bias current Ib is supplied to the laser diode LD. When a value of the monitor voltage Vm becomes equal to that of the voltage Vref/2, the laser diode LD emits at a half amount of the amount of light Po in response to the voltage Vref/2. The half amount of the amount of light Po is hereinafter referred to as an "amount of light Po1/2" as shown in the graph of FIG. 4. A current value of the bias current Ib at this time is defined as a bias current Ish1 as shown in the graph of FIG. 4. The logic circuit 11 sends the pulsed current generating circuit 6 the data signal CODE to allow the pulsed current Ip to be equal to zero, so that the pulsed current Ip is not supplied to the laser diode LD.

After the operations in step S1 are performed, the process goes to step S2.

In step S2 in the flowchart of FIG. 2, the logic circuit 11 allows the selector 12 to output the APC signal Sapc as the control signal CTL1. As shown in FIG. 3, the control signals CTL1 and CTL3 transition from a high level to a low level. That is, when the process of the flow chart of FIG. 2 goes to step S2, the APC signal Sapc is output to turn off the switch SW1 so that the APC operation loop is disabled. When the switch SW1 is turned off, the status of the initialization operations of the semiconductor laser driving circuit 1 moves to a hold mode in which the sample and hold capacitor 2 reserves the voltage VSH stored during an operation of step S1.

When the control signal CTL3 falls to a low level as described above, the operational amplifier AMP2 will attain a high impedance status at the output end thereof, and stops charging the sample and hold capacitor 2. The logic circuit 11 outputs the control signal Vcon to the voltage control circuit 7 to allow the voltage control circuit 7 to output the reference voltage Vref. According to the above-described instruction by the logic circuit 11, the voltage control circuit 7 outputs the reference voltage Vref to the non-inverting input ends of the operational amplifiers AMP1 and AMP2. Under the conditions described above, the logic circuit 11 gradually increases digital data of the data signal CODE to sequentially increase the value of the pulsed current Ip output from the pulsed current generating circuit 6 so that the amount of light Po of the laser diode LD may also gradually increase.

In step S3 in the flowchart of FIG. 2, the operational amplifier AMP1 compares the reference voltage Vref and the monitor voltage Vm, and determines whether a value of the monitor voltage Vm is greater than that of the reference voltage Vref.

When the value of the monitor voltage Vm is equal to or less than that of the reference voltage Vref, the determination result in step S3 is NO and the process goes to step S4.

When the value of the monitor voltage Vm is greater than that of the reference voltage Vref, the determination result in step S3 is YES, and the process goes to step S5.

In step S4 in the flowchart of FIG. 2, the logic circuit 11 increases the digital code of the data signal CODE, and the process goes back to step S3. The process of step S4 repeats until it is determined that the value of the monitor voltage Vm becomes greater than that of the reference voltage Vref.

When the value of the amount of light Po of the laser diode LD comes to an amount of light Po1 as shown in FIG. 4, the monitor voltage Vm becomes equal to the reference voltage Vref, and a next data signal CODE includes the digital data indicating the above-described status. In response to an issuance of the next data signal CODE, a signal output by the operational amplifier AMP1 changes its status from the high level to the low level. Since the signal output by the operational amplifier AMP1 is input to the logic circuit 11, the logic circuit 11 latches the digital code of the data signal CODE set in the pulsed current generating circuit 6 at the falling edge of the signal, that is, when the status of the signal changes from the high level to the low level. When the digital code is latched, the value of the bias current Ib remains in the bias current Ish1 and the value of the pulsed current Ip becomes a pulsed current In1, as shown in FIG. 4.

In step S5 in the flowchart of FIG. 2, the logic circuit 11 outputs the data signal CODE including the digital code that allows the pulsed current Ip to become twice as much as the pulsed current In1, to the pulsed current generating circuit 6. As shown in FIG. 4, the driving current Iop and the amount of light Po of the laser diode LD are in a proportional relationship. Therefore, if the digital code latched by the logic circuit 11 is doubled and the pulsed current Ip is produced to be a pulsed current twice as much as the pulsed current In1, the pulsed current Ip may emit the laser diode LD at the amount of light Po1. Before doubling the digital code, the logic circuit 11 turns on the switch SW2 to discharge the voltage VSH stored in the sample and hold capacitor 2. Turning off the switch SW2 causes the value of the bias current Ib to become zero and the value of the amount of light Po to temporarily drop. The above-described operation is performed to prevent a breakdown due to an excessive light emission of the laser diode LD. The amount of light Po rises as soon as the switch SW2 is turned off.

After the operations in step S5 are performed, the process goes to step S6.

In step S6 in the flowchart of FIG. 2, the logic circuit 11 outputs the control signal CTL2 to the selector 12 so that the selector 12 turns off the switch SW2 again, and allows the selector 12 to output the control signal CTL as the control signal CTL1, to the switch SW1. With the operations described above, the APC operation loop is formed.

As shown in FIG. 3, the status of the control signal CTL3 turns to a high level to activate the operational amplifier AMP2, so that the voltage VSH output by the operational amplifiers AMP1 and AMP2 is quickly charged to the sample and hold capacitor 2 again.

During a regular APC operation, the bias current Ib supplied from the voltage-current conversion circuit 3 is controlled to become a bias current Ish2 that is equal to a threshold current Ith of the laser diode LD. That is, the bias current Ib is generally controlled to make the current value Ish2 equal to the threshold current Ith, as shown in FIG. 4.

After step S6 in the flowchart of FIG. 2, the initialization operation comes to a completion.

With the above-described operation, appropriate pulsed current Ip and bias current Ib may be produced according to a laser diode LD having a threshold current Ith regardless of variations generated in production.

In addition, when an operating temperature of the laser diode LD increases, the threshold current Ith may rise. If the differential quantum efficiency keeps a constant value regardless of the operating temperature, the APC may control the bias current Ib to become a value equal to the threshold current Ith of the laser diode LD at its rising temperature.

Accordingly, the variations of the threshold current Ith from production and these of the operating temperature of the laser diode LD may be calibrated, thereby a stable optical pulse may be obtained.

Operations of the operational amplifier AMP2 are described.

The operational amplifier AMP2 is used for a fast charging to reduce a charging time period of the sample and hold capacitor 2 during the initialization operation. The operational amplifier AMP2 is designed to have an output current greater than that of the operational amplifier AMP1. The operational amplifier 2 receives the control signal CTL3, which activates during the APC operation and stops when the APC operation is terminated, with its output end in a high impedance status.

As described above, connecting the operational amplifiers AMP1 and AMP2 in parallel, a time period for the APC operation during the initialization operation may be reduced.

As described above, the operational amplifier AMP2 activates with the control signal CTL3. As an alternative, the operational amplifier AMP2 may have an offset voltage at an input end of a differential amplification circuit of the operational amplifier AMP2 so that the operational amplifier AMP2 may stop the charging operation by itself. In this case, even though a voltage input to the inverting input end of the operational amplifier AMP2 is smaller than that input to the non-inverting input end, the offset voltage may be arranged so that an inversion of an output level occurs at the output end of the operational amplifier AMP2. For example, when the offset voltage is set to 100 mV and the reference voltage Vref is set to 1V, the operational amplifier AMP2 stops the charging operation of the sample and hold capacitor 2 at the monitor voltage Vm of 0.9V.

The output circuit of the operational amplifier AMP2 is used to solely perform the charging operation of the sample and hold capacitor 2, and does not need to include a device for the discharging operation of the sample and hold capacitor 2. This is to avoid a situation that, when the inversion of the output level occurs at the output end of the operational amplifier AMP2, the sample and hold capacitor 2 may discharge the voltage stored in the sample and hold capacitor 2. With the above-described structure, the laser diode LD does not excessively emit at the end of APC operation, the operational amplifier AMP2 terminates the charging operation by itself, and the operation amplifier AMP1 alone may control the APC operation.

Turning now to the resistor 14, the setting of its resistance specifying the time period of the initialization operation is described.

In steps of the initialization operation, the operational amplifiers AMP1 and AMP2 compare the monitor voltage Vm, which is converted according to the monitor current Im output by the photodiode PD, and one of the voltages Vref and Vref/2 output by the voltage control circuit 7. To perform a precise detection of the amount of light of the laser diode LD, the monitor voltage Vm generated by the variable resistor VR1 and the voltage VSH of the predetermined connection point of the output ends of the operational amplifiers AMP1 and AMP2 need to be sufficiently determined.

The voltage VSH is determined according to a capacitance value of the sample and hold capacitor 2. The capacitance value of the sample and hold capacitor 2 is also set to an optimal value according to a band of the photodiode PD to be used, so that the APC operation may stably be performed. For example, when the photodiode PD has a slow speed in response, the capacitance value of the sample and hold capacitor 2 is increased and the response speed of the operational amplifier AMP1 is reduced, so as to have the APC operation stably performed. That is, steps of the initialization operation may take a long time period.

To avoid the above-described condition, the frequency of the clock signal CLK generated by the oscillation circuit 3 may be controlled from the outside of the integrated circuit (IC) of the semiconductor laser driving circuit 1. With the above-described structure, timings of each step of the initialization operation may be controlled by the logic circuit 11 that is operated by the clock signal CLK, and the an optimal timing according to the response speed of the photodiode PD and the operational amplifier AMP1 may be set. Therefore, the differential quantum efficiency can be detected more precisely.

In recent years, image forming apparatuses such as printers may increase their processing speed, that is, the number of outputs per predetermined period, and may employ a multi-beam function for writing data using a plurality of beams. As techniques of the image forming apparatuses increasingly develop, the image forming apparatuses may generally be demanded to have a shorter period permissible to the initialization operation. On the other hand, an image forming apparatus performing a low-speed copy production, that is, producing a smaller number of outputs per predetermined period, generally has no such demand.

As previously described, the semiconductor laser driving circuit 1 of the present invention has the resistor 14 externally provided. When the resistor value 14 is changed, a time period to perform the initialization operation may be flexibly changed to be applied to various systems.

Figure 5:
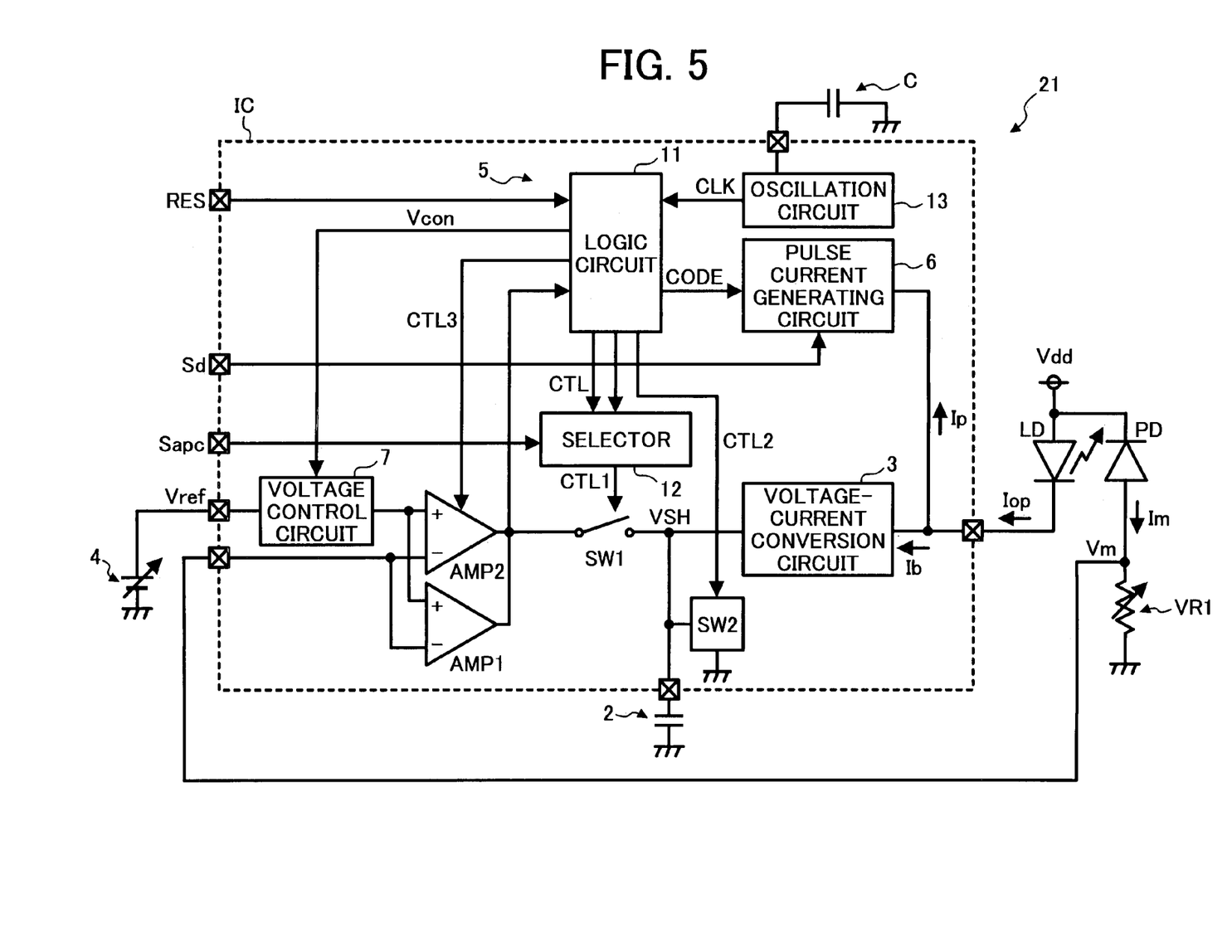
FIG. 5 is a block diagram of another system structure of a semiconductor laser driving circuit according to an alternative exemplary embodiment of the present invention.

FIG. 5 shows a structure of a semiconductor laser driving circuit 21. The semiconductor laser driving circuit 21 is an alternative example of the semiconductor laser driving circuit 1, and units and circuits shown in FIG. 5 are identical to respective units and circuits shown in FIG. 1, except for a capacitor C. The capacitor C shown in FIG. 5 may be a replacement of the resistor 14 shown in FIG. 1. In this case, a change of a capacitance value of the capacitor C may change a frequency of the clock signal CLK generated by the oscillation circuit 13. If the capacitor C is externally arranged in FIG. 5, the semiconductor laser driving circuit 21 may obtain efficiency similar to that obtained by the resistor 14 provided for the semiconductor laser driving circuit 1.

As described above, the semiconductor laser driving circuit 1 according to the exemplary embodiment of the present invention may change the resistor value 14, which is externally provided to the semiconductor laser driving circuit 1, to change the clock signal CLK to be supplied to the logic circuit 11, so that the time periods of the respective steps of the initialization operations may be changed. With the above-described control, an optimal timing period according to the response speed of the photodiode PD and the operational amplifier AMP1 may be set, and the differential quantum efficiency may be detected more precisely.

When the sample and hold capacitor 2 performs the charging operation with the switch SW1 turned on, the operational amplifier AMP2, which is designed to have an output current supplying capability greater than that of the operational amplifier AMP1, is activated to charge the sample and hold capacitor 2. With the system described above, the respective operational amplifiers AMP1 and AMP2 may charge the sample and hold capacitor 2, and thereby performing a high speed operation of the APC operation, regardless of use conditions of the laser diode LD including variation from production, temperature and amount of light, and the capacitance value of the sample and hold capacitor.

Numerous additional modifications and variations are possible in light of the above teachings. It is therefore to be understood that within the scope of the appended claims, the disclosure of this patent specification may be practiced otherwise than as specifically described herein.

What is claimed is:

1. A semiconductor laser driving circuit, comprising:
    a light amount detector configured to detect an amount of light emitted by a laser diode, and output a first voltage corresponding to the amount of light;
    a frequency determiner configured to determine a frequency determining a time period of a detecting operation to detect differential quantum efficiency of the laser diode;
    a clock signal generator configured to generate a clock signal based on the frequency;
    a bias current generator configured to generate a bias current having a direct current and output the bias current to the laser diode to cause the first voltage output by the light amount detector to accord with a predetermined target voltage;
    a logic controller configured to perform the detecting operation in accordance with the clock signal, output a data code signal indicating a current modulation value derived from the differential quantum efficiency of the laser diode to the pulsed current generator and a control signal specifying a second voltage to the bias current generator, and vary the time period of the detection operation according to the clock signal generated based on the frequency determined by the frequency determiner; and
    a pulsed current generator configured to generate a pulsed current responsive to the data code signal, and output the pulsed current to the laser diode in response to an external control signal.

2. The semiconductor laser driving circuit according to claim 1, wherein the bias current generator comprises:
    a operational amplifier circuit configured to compare the first voltage output by the light amount detector and the second voltage specified by the logic controller, and output a third voltage indicating a difference between the first and second voltages to control the bias current;

a voltage-current conversion circuit configured to convert the third voltage from the operational amplifier circuit into the bias current, and output the bias current to the laser diode;

a switch configured to operate at an instruction of the logic controller, and allow a passage of the third voltage from the operational amplifier circuit; and a sample and hold capacitor configured to store the third voltage output from the operational amplifier circuit, and output the third voltage to the voltage-current conversion circuit.

3. The semiconductor laser driving circuit according to claim 2, wherein the logic controller controls the switch to charge the third voltage output by the operational amplifier circuit to the sample and hold capacitor.

4. The semiconductor laser driving circuit according to claim 2, wherein the operational amplifier circuit comprises:

a first operational amplifier configured to control the third voltage of the sample and hold capacitor by an intermediary of the switch, and induce the first voltage output by the light amount detector to accord with the second voltage specified by the logic controller; and a second operational amplifier configured to increase an operating current at an instruction of the logic controller, the second operational amplifier being disposed in parallel with the first operational amplifier.

5. The semiconductor laser driving circuit according to claim 4, wherein the frequency determiner includes a resistor, and wherein the frequency is determined according to a resistor value.

6. The semiconductor laser driving circuit according to claim 5, wherein the pulse current generator, the voltage-current conversion circuit of the bias current generator, the operational amplifier circuit, the switch, the logic controller, and the clock signal generator are integrated on a single integrated circuit.

7. The semiconductor laser driving circuit according to claim 6, wherein the resistor is disposed external to the single integrated circuit.

8. A semiconductor laser driving circuit, comprising:

means for detecting an amount of light emitted by a laser diode, and outputting a first voltage corresponding to the amount of light;

means for determining a frequency determining a time period of a detecting operation to detect differential quantum efficiency of the laser diode;

means for forming a clock signal based on the frequency;

first means for generating a bias current having a direct current and outputting the bias current to the laser diode to cause the first voltage output by the means for detecting to accord with a predetermined target voltage;

means for controlling the detecting operation in accordance with the clock signal, outputting a data code signal indicating a current modulation value derived from the differential quantum efficiency of the laser diode to the second means for generating and a control signal specifying a second voltage to the first means for generating, and varying the time period of the detection operation according to the clock signal generated based on the frequency determined by the means for determining; and second means for generating a pulsed current responsive to the data code signal, and outputting the pulsed current to the laser diode in response to an external control signal.

9. The semiconductor laser driving circuit according to claim 8, wherein the first means for generating comprises:

means for comparing the first voltage output by the means for detecting and the second voltage specified by the means for controlling, and outputting a third voltage indicating a difference between the first and second voltages to control the bias current;

means for converting the third voltage from the means for comparing into the bias current, and outputting the bias current to the laser diode;

means for switching an operation, at an instruction of the means for controlling, to allow a passage of the third voltage from the means for comparing; and means for storing the third voltage output from the means for comparing, and output the third voltage to the means for converting.

10. The semiconductor laser driving circuit according to claim 9, wherein the means for comparing receives an instruction of the means for controlling, and wherein the means for controlling controls the means for switching to charge the third voltage output by the means for comparing to the means for storing.

11. The semiconductor laser driving circuit according to claim 9, wherein the means for comparing comprises:

first means for amplifying the third voltage of the means for storing by an intermediary of the means for switching, and induce the first voltage output by the means for detecting to accord with the second voltage specified by the means for controlling; and second means for amplifying an operating current at an instruction of the means for controlling, the second means for amplifying being disposed in parallel with the first means for amplifying.

12. The semiconductor laser driving circuit according to claim 11, wherein the means for determining includes a resistor, and wherein the frequency is determined according to a resistor value.

13. The semiconductor laser driving circuit according to claim 12, wherein the second means for generating, the means for converting of the first means for generating, the means for comparing, the means for switching, the means for controlling, and the means for forming are integrated on a single integrated circuit.

14. The semiconductor laser driving circuit according to claim 13, wherein the resistor is disposed external to the single integrated circuit.

15. A method of driving a semiconductor laser, comprising the steps of:

detecting an amount of light emitted by a laser diode;

outputting a first voltage corresponding to the amount of light;

determining a frequency determining a time period of a detecting operation to detect differential quantum efficiency of the laser diode;

forming a clock signal based on the frequency;

performing the detecting operation in accordance with the clock signal;

issuing a data code signal indicating a current modulation value derived from the differential quantum efficiency of the laser diode and a control signal specifying a second voltage;

generating a bias current based on the second voltage to cause the first voltage to accord with a predetermined target voltage;

supplying the bias current to the laser diode;

producing a pulsed current responsive to the data code signal; and supplying the pulsed current to the laser diode in response to an external control signal.

16. The method according to claim 15, wherein the generating step comprises the steps of:

comparing the first voltage output by the detecting step and the second voltage specified by the performing step;

outputting a third voltage indicating a difference between the first and second voltages to control the bias current;

converting the third voltage output by the comparing step into the bias current;

outputting the bias current to the laser diode;

switching an operation to allow a passage of the third voltage output by the comparing step;

storing the third voltage output by the comparing step; and outputting the third voltage for the converting step.

17. The semiconductor laser driving circuit according to claim 16, wherein the comparing step receives an instruction output by the performing step, and controls a supply capacity thereof to output the second voltage, and wherein the performing step controls the switching step to charge the third voltage output by the comparing step to the storing step, and causes the comparing step to increase the supply capacity of the comparing step.

18. The semiconductor laser driving circuit according to claim 16, wherein the comparing step comprises:

increasing the third voltage output by the storing step after the switching step;

inducing the first voltage output by the detecting step to accord with the second voltage specified by the performing step; and amplifying an operating current at an instruction by the performing step.

19. The semiconductor laser driving circuit according to claim 18, wherein the determining step includes a resistor, and wherein the frequency is determined according to a resistor value.

* * * * *